(12) United States Patent
Takada et al.

(10) Patent No.: US 6,528,379 B2
(45) Date of Patent: Mar. 4, 2003

(54) METHOD FOR MANUFACTURING SEMICONDUCTOR INTEGRATED CIRCUIT DEVICE

(75) Inventors: Tadayoshi Takada, Saitama (JP); Osamu Kitamura, Gunma (JP); Shigeaki Okawa, Tochigi (JP); Hirotsugu Hata, Gunma (JP); Chikao Fujinuma, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/946,948

(22) Filed: Sep. 5, 2001

(65) Prior Publication Data
US 2002/0028551 A1 Mar. 7, 2002

(30) Foreign Application Priority Data
Sep. 7, 2000 (JP) ........................................ 2000-271381

(51) Int. Cl.[7] ............................................. H01L 29/788
(52) U.S. Cl. ...................... 438/322; 438/341; 438/360; 438/413; 438/424; 438/430; 438/455

(58) Field of Search .................................. 438/322, 340, 438/341, 353, 355, 359, 360, 361, 363, 412, 413, 424, 429, 430, 455

(56) References Cited

U.S. PATENT DOCUMENTS 4,624,047 A * 11/1986 Tani ............................ 438/404

FOREIGN PATENT DOCUMENTS

JP          11-354535          12/1999

* cited by examiner

Primary Examiner—Olik Chaudhuri
Assistant Examiner—Theresa T. Doan
(74) Attorney, Agent, or Firm—Fish & Richardson P.C.

(57) ABSTRACT

A buried layer of a collector region and a buried layer of a collector taking-out region are formed at the same time at each epitaxial layer when the collector region and the collector taking-out region of the semiconductor integrated circuit device according to the invention. Each buried layer is diffused to connect, and etched in V-groove. By that, the collector region and collector taking-out region made thick in film are formed at the same time so as to realize the semiconductor integrated circuit device of high withstanding voltage.

15 Claims, 11 Drawing Sheets

METHOD FOR MANUFACTURING SEMICONDUCTOR INTEGRATED CIRCUIT DEVICE

BACKGROUND OF THE INVENTION

The present invention relates to a semiconductor integrated circuit device and a method for manufacturing the same realizing high with stand voltage in an dielectric-isolated complementary bipolar transistor by provision of thickened collector region.

In recent years, a high with stand voltage and a high-degree of integration of transistors used in an audio amplifier, a display driver, etc. have been demanded. High degree of integration and high speed of a high withstand voltage (or high voltage) integrated circuit is preferably realized by the dielectric isolation technique in order to prevent a parasitic transistor from being formed and prevents a chip size from being increased owing to element isolation.

FIG. 13 shows a sectional view of a conventional typical semiconductor integrated circuit device (e.g. Japanese Patent Publication No. 11-354535). Now referring to FIGS. 14–20, an explanation will be given of a method for manufacturing the semiconductor integrated circuit device shown in FIG. 13.

FIG. 14 shows an area where a high voltage vertical NPN vertical transistor is to be formed and another area where a high voltage vertical PNP transistor is to be formed. First, a buried oxide film 2 having a thickness of about 2 $\mu$m is formed on the surface of an N type substrate 3 of Si by thermal oxidation. The N type substrate is bonded to a supporting substrate 1 through the buried oxide film 2 at room temperature. The N type substrate 3 will be changed into an N$^+$ type buried layer 4 and a P$^+$ type buried layer 5, which are active layers, by the subsequent step. The N type substrate 3 may be a silicon substrate having e.g. resistivity of about 10 $\Omega$·cm. Thereafter, the substrate 3 is annealed in an atmosphere of oxygen e.g. for about two hours at 1000° C. to increase the bonding strength between the buried oxide film 2 and supporting substrate 1. Further, the thickness of the N type substrate 3 is reduced to a prescribed thickness, e.g. 2 $\mu$m by e.g. mechanical polishing or chemical-mechanical polishing (CMP).

Next, ion implantation is executed in order to form an N$^+$ buried layer 4. Specifically, by known photolithography, using as a mask photoresist (not shown) with an opening at an NPN transistor section, N type impurities of e.g. arsenic (As) are ion-implanted at an accelerating voltage of 50 keV and dose of 3×10$^{15}$/cm$^2$. Thereafter, the photoresist is removed. Further ion-implantation is executed to form a P$^+$ type buried layer 5. Specifically, by known photolithography, using as a mask photo resist (not shown) with an opening at a PNP transistor section, P type impurities of e.g. boron (B) are ion-implanted at an accelerating voltage of 50 keV and dose of 3×10$^{15}$/cm$^2$. Thereafter, the photoresist is removed.

Subsequently, the substrate is annealed in an atmosphere of water vapor e.g. for about one hour at 1100° C. so that the arsenic introduced in the NPN transistor section and boron introduced in the PNP transistor section in the previous step are thermally diffused, respectively, thereby forming the N$^+$ type buried layer 4 and the P$^+$ type buried layer 5. In this annealing step, an oxide layer (not shown) is formed on the surface of the active layer. So, this oxide layer is removed by light etching using e.g. a hydrofluoric acid solution, which results in a structure as shown in FIG. 14.

Next, as shown in FIG. 15, an N type epitaxial layer 6 having resistively of 10 $\Omega$·cm and a film thickness of 15 $\mu$m is grown on the N$^+$ type buried layer 4 and the P$^+$ type buried layer 5 which are the active layers. The NPN transistor section of the N type epitaxial layer 6 constitutes an N type collector region 7, whereas the PNP transistor section of the N type epitaxial layer 6 is changed into a P type collector region 8 by the subsequent step. Specifically, an oxide film 9 having a thickness of 50 nm is formed by thermal oxidation. By known photolithography, using as a mask photoresist with an opening at a PNP transistor section, P type impurities of e.g. boron (B) are ion-implanted at an accelerating voltage of 300 keV and dose of 8×10$^{12}$/cm$^2$. The substrate is annealed in an atmosphere of inert gas for e.g. 7 (seven) hours at 1200° C. to form the P type collector region 8 of the PNP transistor, which results in a structure as shown in FIG. 15.

By known photolithography, using as a mask photoresist with an opening on a base portion of the NPN transistor, P type impurities of e.g. boron (B) are ion-implanted at an accelerating voltage of 40 keV and dose of 1×10$^{14}$/cm$^2$. After the photoresist has been removed, by known photolithography, using as a mask photoresist with an opening on a base region of the PNP transistor, N type impurities of e.g. phosphorous (P) are ion-implanted at an accelerating voltage of 60 keV and dose of 1×10$^{14}$/cm$^2$. After the photoresist has been removed, the substrate is annealed in an atmosphere of inert gas for e.g. 30 minutes at 900° C. As a result, the impurities are thermally diffused to form a P type base region 10 of the NPN transistor and an N type base region 11 of the NPN transistor, respectively.

Next, by known photolithography, using as a mask photoresist with openings on an N type emitter region and an N type collector contact of the NPN transistor, N type impurities of e.g. arsenic (As) are ion-implanted at an accelerating voltage of 110 keV and dose of 5×10$^{15}$/cm$^2$. Thereafter, the photoresist is removed. Subsequently, by known photolithography, using as a mask photoresist with openings on a P type emitter region and a P type collector contact of the PNP transistor, P type impurities of e.g. boron (B) are ion-implanted at an accelerating voltage of 40 keV and dose of 3×10$^{15}$/cm$^2$. After the photoresist has been removed, the substrate is annealed in an atmosphere of inert gas for e.g. about 30 minutes at 1000° C. As a result, the impurities are thermally diffused to form an N$^+$ type emitter region 12 and an N$^+$ type collector contact 13 of the NPN transistor, and a P$^+$ type emitter region 14 and P$^+$ type collector contact of the PNP transistor, respectively. Thus, the structure as shown in FIG. 16 results.

Thereafter, the oxide layer 9, N type collector layer and N$^+$ type buried layer 4 of the NPN transistor section are etched to reach the buried oxide layer 2, thereby forming a trench 16 for element isolation. Simultaneously, the oxide layer 9, P type collector layer 8 and P type buried layer 5 of the PNP transistor section are etched to reach the buried oxide layer 2, thereby forming a trench 16 for element isolation. The trenches 16 are formed so that the sides of the collector contacts 13 and 15 are exposed within the trenches 16, respectively. Thus, the structure as shown in FIG. 17 results.

Next, by e.g. thermal oxidation, an oxide film 17 having a thickness of about 500 nm is formed on the inner wall of the trench 16. Further, the oxide film 17 abutting on the collector contacts 13 and 15 of the NPN transistor and PNP transistor is removed by etching. Thus, the structure as shown in FIG. 18 results. By e.g. Chemical Vapor Deposition (CVD), poly-Si 18 is deposited to be buried within the trench 16 with the oxide film 17. Thereafter, the poly-Si 18 which has overflowed is etched back by Reactive Ion Etching (RIE) to flatten the substrate surface. Thus, the structure as shown in FIG. 19 results.

N type impurities are introduced into the poly-Si 18 buried in the trench 16 which abuts on the N⁺ type collector contact 13 of the NPN transistor. Specifically, by known photolithography, using as a mask photoresist with an opening at the trench, N type impurities of e.g. phosphorous (P) are ion-implanted at an accelerating voltage 180 keV and dose of $5 \times 10^{15}/\text{cm}^2$. Further, P type impurities are introduced into the poly-Si 18 buried in the trench 16 which abuts on the P⁺ type collector contact 15 of the PNP transistor. Specifically, by known photolithography, using as a mask photoresist with an opening at the trench, P type impurities of e.g. boron (B) are ion-implanted at an accelerating voltage of 180 keV and dose of $5 \times 10^{15}/\text{cm}^2$.

Subsequently, the substrate is annealed in an atmosphere of inert gas for e.g. about 30 minutes at 1000° C. As a result, the phosphorous (P) is thermally diffused from the trench of the NPN transistor, thereby forming an N⁺ type diffused layer 18n which connects the N+ type buried layer 4 and the N+ type collector contact 13. Simultaneously, boron (B) is thermally diffused from the trench of the PNP transistor, thereby forming a P⁺ type diffused layer 18p which connects the P⁺ buried layer 5 and the P⁺ type collector contact 15. Specifically, since the speed of diffusing the impurities in poly-Si is several tens of times as high as that in monocrystal Si, the impurities are diffused from the poly-Si within the trench into the monocrystal Si (epitaxial layer) of the collector region in a short time. The impurities which have moved into the collector region are diffused at the same speed as that in the monocrystal Si and accumulated in a layer at the interface between the trench and the collector region, thereby forming N⁺ type diffused layer 18n and the P⁺ type diffused layer 18p (collector walls). Thus, the structure as shown in FIG. 20 results.

Next, by e.g. CVD, an oxide film 19 is deposited on the entire surface of the substrate. Further, photoresist is deposited on the entire surface, and by known photolithography, openings are made at the positions where electrode are to be formed. Using the photoresist as a mask, by e.g. RIE, the openings are made in the oxide film 19 and the portions thereof where the electrodes are to be formed. By e.g. sputtering, aluminum (Al) 20 is deposited on the entire surface of the oxide film 19 with the openings at the portions where the electrodes are to be formed. Thereafter, photoresist is deposited on the entire surface, and by known photolithography, the photoresist is removed at the other portions than the portions where the electrodes are to be formed. Using the remaining photoresist as a mask, by e.g. RIE, the aluminum 20 is patterned. By removing the photoresist after the electrodes have been formed, the semiconductor device whose section is shown in FIG. 13 results.

In the semiconductor device having the structure as described above, the NPN transistor and PNP transistor which are adjacent to each other are electrically isolated by the dielectric isolation technique. Thus the degree of integration is enhanced, and the parasitic capacitance of the PN junction in each transistor can be reduced. This contribute to the high speed operation of the device. Further, in the semiconductor device having the structure as described above, the base-collector withstand voltage is assured by reducing the impurity concentration in the collector region 7, 8. However, reduction in the impurity concentration in the entire collector regions 7, 8 increases the series resistance of the collector, thus deteriorating the characteristic. In order to obviate such an inconvenience, under the lightly doped collector regions 7 and 8, the collector walls (N⁺ diffused layer 18n, P⁺ diffused layer 18p) are formed which connect the highly doped buried layers 4, 5 and the collector contacts 13, 15, respectively. In this way, the high with stand voltage of the bipolar transistor can be realized while the high speed operation which is a benefit of the bipolar transistor is utilized.

In the conventional semiconductor integrated circuit device, the lightly-doped collector regions 7 and 8, i.e. N type epitaxial layer 6 must be formed be thick in order to realize a high withstand voltage. In this case, in order to diffuse impurities from the surface of the N type epitaxial layer 6, heat treatment for a long time at a high temperature is required so that making the thick film of the collector regions has a limitation in process. Therefore, the film thickness of the collector regions formed of a single epitaxial layer has a limitation to realize the high with stand voltage. Accordingly, the conventional semiconductor integrated circuit could not provide a necessary withstand voltage.

In the conventional method of manufacturing a semiconductor integrated circuit device, in order to realize a dielectric-isolated complementary transistor pair composed of an NPN transistor and a vertical PNP transistor which are formed to be adjacent to each other on a single chip, a trench was used to isolate both transistors from each other. However, the trench has a limitation in depth and imperfection in an etching accuracy. Therefore, the conventional method has a problem that the etching for element isolation, attended with the thick film of the epitaxial layer for realizing the high withstand voltage, is difficult.

Where the lightly-doped collector regions 7 and 8, i.e. N type epitaxial layer 6 are made thick in order to realize the high withstand voltage, the lightly-doped collector region 8 of the vertical PNP transistor must be formed in such a manner that the ion-implanted impurities are heat treated for a long time at a high temperature. Therefore, the formation of the thick film of the N type epitaxial layer has a limitation in process, and increase the production cost. Further, ion-implanting at a high accelerating voltage and high dose for the purpose of increasing the depth of the impurity diffusion disadvantageously makes the crystal defect of the Si substrate remarkable.

SUMMARY OF THE INVENTION

The invention is carried out in view of the above-mentioned conventional problem. A method for manufacturing a semiconductor integrated circuit device comprising: a step of preparing one conductive semiconductor substrate; a step of forming plural opposite conductive epitaxial layers on said substrate, diffusing the one conductive and the opposite conductive buried layers formed on said substrate and said epitaxial layers to connect, and forming a first and second buried layers consisting of high concentration impurity diffusing layer at a first and second island regions and periphery of the first and second islands region; a step of etching the both end portions of said first and second island regions in V groove shape remaining said first and second buried layers, a step of forming an oxide film on the surface of said first and second buried layers and forming a polycrystal semiconductor layer on the oxide film; a step of forming an oxide film on said polycrystal semiconductor layer and bonding a supporting substrate through the oxide film; and a step of polishing said semiconductor substrate setting said supporting substrate to the bottom face till said first and second island regions are exposed.

In the method for manufacturing the semiconductor integrated circuit device according to the invention, it is characterized in that process etching said first and second island regions is suitably a process etching in V groove in order to remove completely the border face between said buried layer consisting of low concentration impurity diffusing layer forming said first and second island regions and said epitaxial layer, to etch completely to the bottom portion of said first and second island regions made thick in film, and to realize dielectric-isolated complementary bipolar transistors.

In the method for manufacturing the semiconductor integrated circuit device according to the invention, the buried layer comprising high concentration impurity diffusing layer formed at periphery of the collector region is suitably formed at the same time forming the buried layer forming the collector region, and along inclined lines of V groove etching. Thus, high concentration buried layer too is formed at the same time by process of V groove etching isolating elements between said first and second island regions so as to shorten manufacturing process of the semiconductor integrated circuit device.

In the method for manufacturing the semiconductor integrated circuit device according to the invention, generation of crystal defect at the substrate can be clearly decreased comparing with a forming collector taking-out diffusion layer ion-injecting on surface of the substrate because ion injection is carried out on surface of the epitaxial layer.

DETAILED DESCRIPTION OF THE PREFERRED EMBODIMENT

Figure 1:
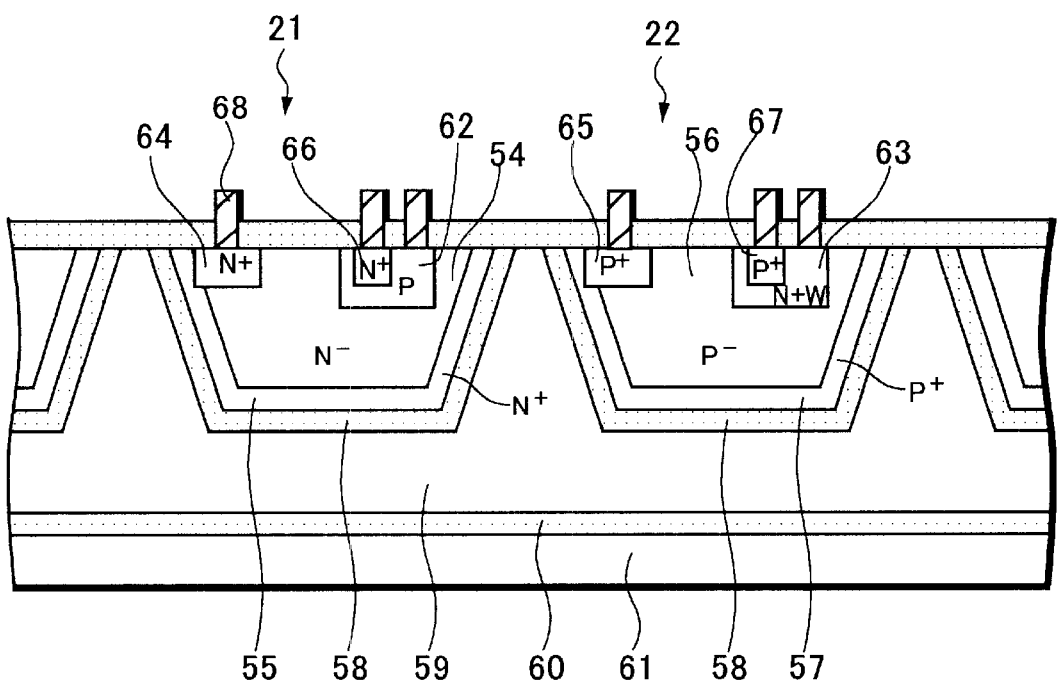
FIG. 1 is a sectional view for explaining the semiconductor integrated circuit device according to the invention.

A semiconductor integrated circuit device and a method for manufacturing the same according to the invention will be described in detail below referring to the drawings.

FIG. 1 is a sectional view of a first embodiment of an IC according to this invention in which a high voltage NPN transistor 21 and a high voltage vertical PNP transistor 22 are formed through poly-Si 59 as dielectric-isolated complementary bipolar transistors.

In the semiconductor integrated circuit device according to this invention, poly-Si 59 is formed on a supporting substrate 61 covered with a silicon oxide film 60. The supporting substrate 61 is bonded to the poly-Si 59 through the silicon oxide film 60 by heat treatment for about two hours at 1100° C.–1200° C. The dielectric-isolated complementary bipolar transistors are formed through the poly-Si 59.

In the high voltage NPN transistor 21, a silicon oxide film 58 and a $N^+$ type buried layer 55 are formed to surround a collector 54. The collector region 54 includes an $N^+$ type diffused region 64 serving as a collector taking-out region, a P type diffused region 62 serving as a base region and an $N^+$ type diffused layer 66 serving as an emitter region. In this case, the collector taking-out region 64, which is coupled with the $N^+$ buried region 55, constitutes an $N^+$ highly doped layer, thus realizing a structure with a reduced collector resistance of the high voltage NPN transistor 21.

In the high voltage vertical PNP transistor 22, a silicon oxide film 58 and a $P^+$ buried layer 57 are formed to surround a collector region 56. The collector region 56 includes a $P^+$ type region 65 serving as a collector taking-out region, an $N^+$ type well region 63 serving as a base region and a $P^+$ type diffused region 67 serving as an emitter region. In this case, the collector taking-out region 65, which is coupled with the $P^+$ buried region 57, constitutes a $P^+$ highly doped layer, thus realizing a structure with a reduced collector resistance of the high voltage PNP transistor 22.

Although not shown, where these transistors are formed integrally to other peripheral circuits in a monolithic circuit, electrode wirings of Al, interlayer insulating film of polyimide insulating film and a polyimide jacket coating, etc. are formed on these elements.

In the semiconductor integrated circuit device, the N+ type and P+ type buried layers 55 and 57, which are formed on the periphery of the N− type and P− type collector regions 54 and 56, respectively, are coupled with the collector taking-out regions 64 and 65, respectively. This provides the N+ type and P+ type highly-doped layers to reduce the collector resistance so that the collector regions 54 and 56 can be made thick. Thus, the high voltage complementary bipolar transistors can be formed.

Figure 13:
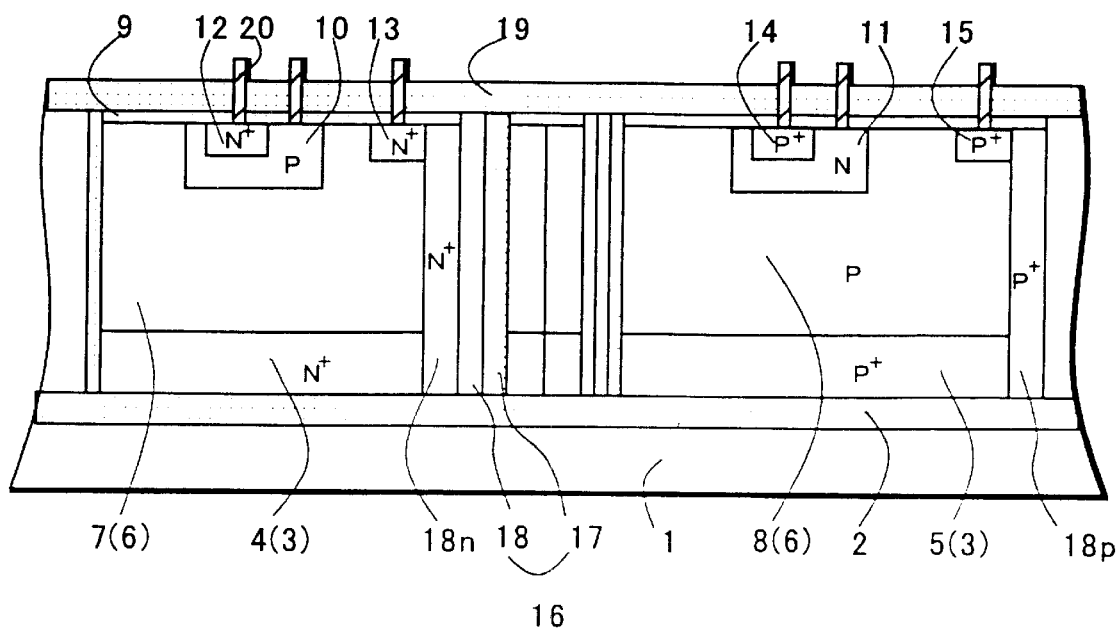
FIG. 13 is a sectional view for explaining the conventional semiconductor integrated circuit.
Figure 14:
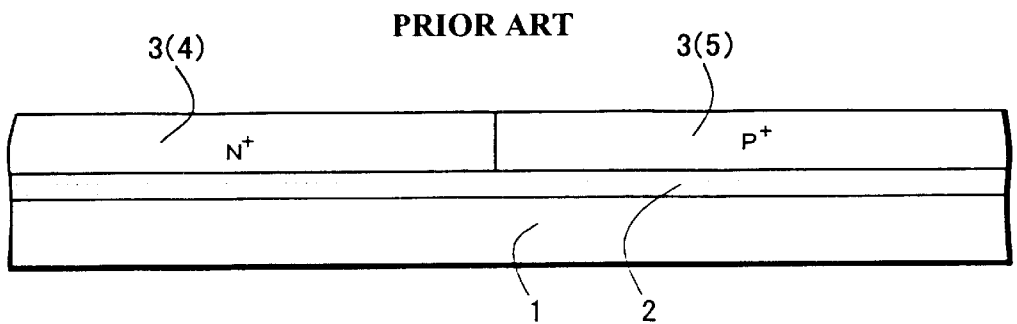
FIG. 14 is a sectional view for explaining a method for manufacturing the conventional semiconductor integrated circuit device.
Figure 15:
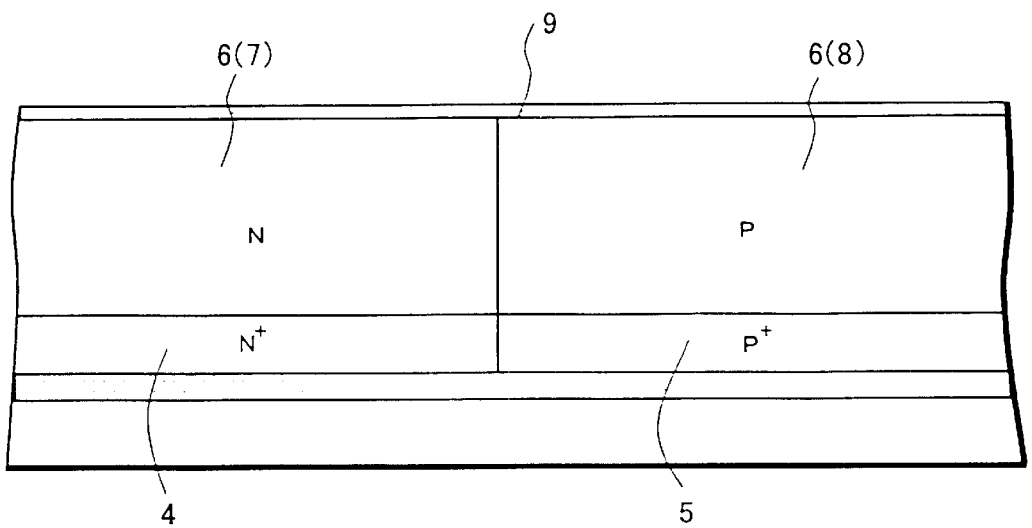
FIG. 15 is a sectional view for explaining a method for manufacturing the conventional semiconductor integrated circuit device.
Figure 16:
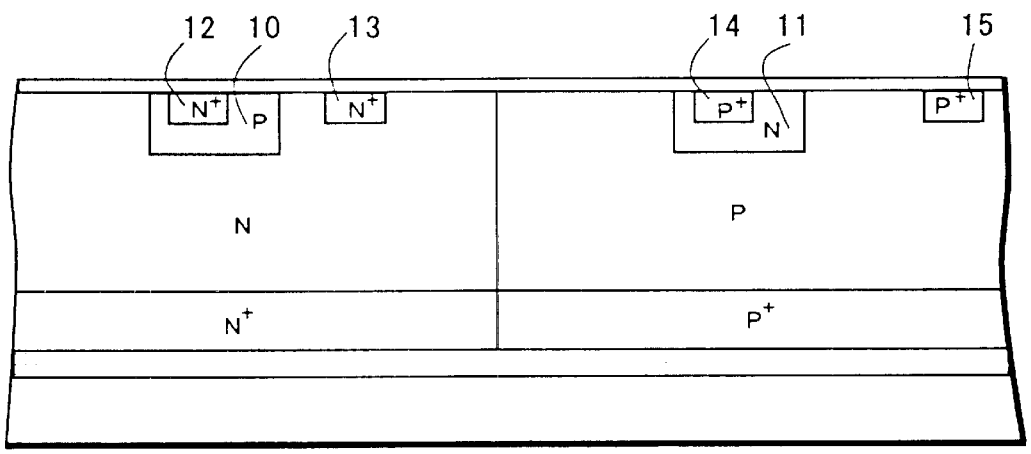
FIG. 16 is a sectional view for explaining a method for manufacturing the conventional semiconductor integrated circuit device.
Figure 17:
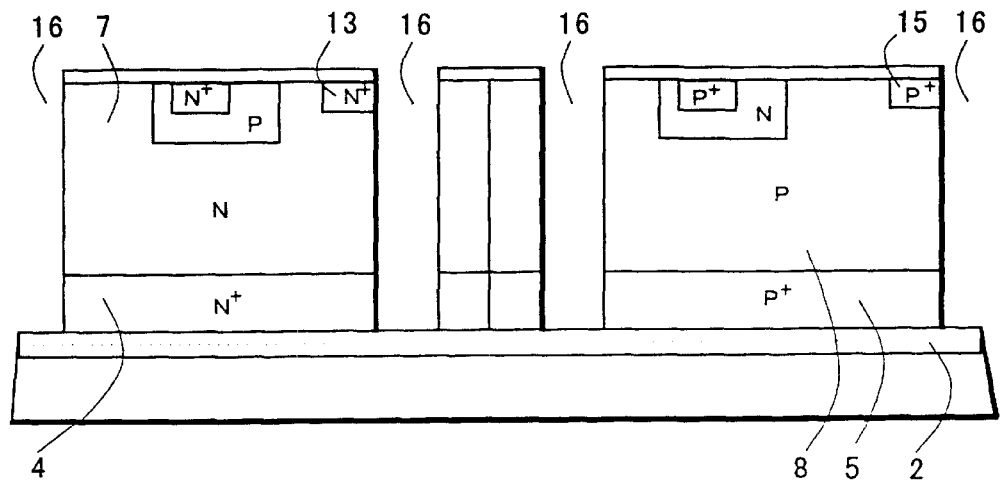
FIG. 17 is a sectional view for explaining a method for manufacturing the conventional semiconductor integrated circuit device.
Figure 18:
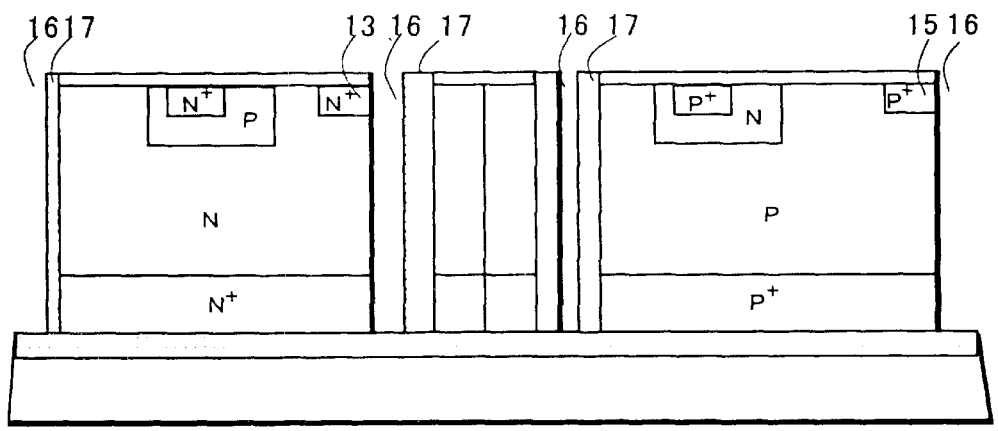
FIG. 18 is a sectional view for explaining a method for manufacturing the conventional semiconductor integrated circuit device.
Figure 19:
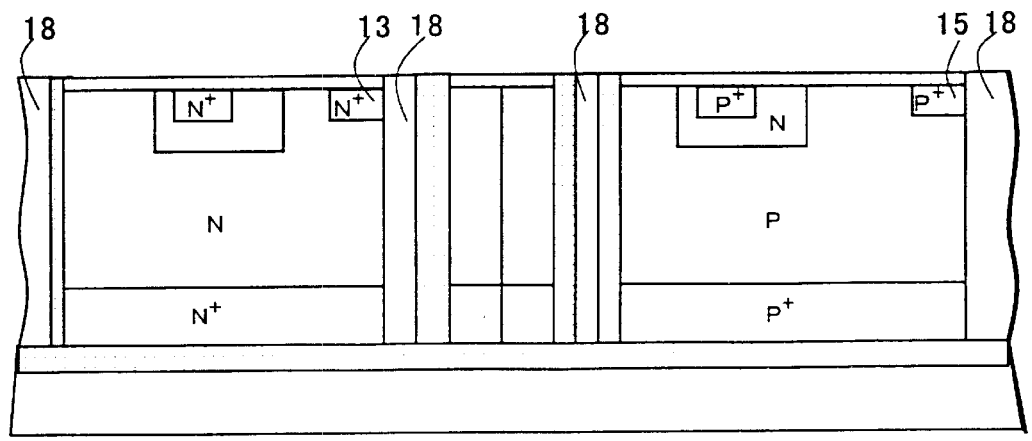
FIG. 19 is a sectional view for explaining a method for manufacturing the conventional semiconductor integrated circuit device.
Figure 20:
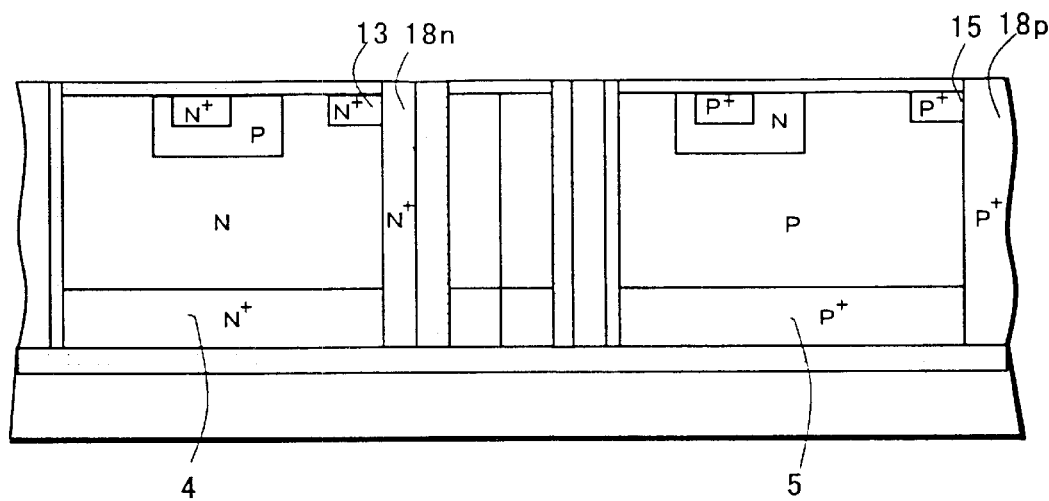
FIG. 20 is a sectional view for explaining a method for manufacturing the conventional semiconductor integrated circuit device.

Concretely, FIG. 13 shows a relationship between a collector region film thickness and a withstand voltage in the dielectric-isolated complementary transistors in the semiconductor integrated circuit device according to this invention. As understood from the characteristic graph of FIG. 13, with the film thickness of the collector region of 90 μm, the collector-emitter withstand voltage of 300 V can be obtained so that the high voltage complementary bipolar transistors can be formed. In order to obtain the collector-emitter voltage $V_{ceo}$ of 250 V or higher, the film thickness of about 60 μm or larger is required. This film thickness far exceeds the limitation in the manufacturing method using a trench.

In the semiconductor integrated circuit device according to this invention, as described above, the NPN transistor 21 and PNP transistor 22 are surely dielectric-isolated through the poly-Si 59. For this reason, influence of the transistors 21 and 22 from each other and creation of the parasitic transistor can be suppressed so that the semiconductor integrated circuit device is more suitable for a high frequency operation.

Further, a P type monocrystal Si substrate 23 of a crystal axis of (100) has a resistivity of at least 50 Ω·cm. An epitaxial layer is stacked on the substrate 23 to form an area where transistors are to be formed. In this invention, multiple epitaxial layers are stacked. In this case, the substrate 23 is placed at a high temperature for a long time. For example, where four epitaxial layers are stacked, the substrate is placed at about 1000–1400° C. for 24 hours. In view of this, as described above, the substrate having low resistivity is used, the creep from the substrate 23 can be suppressed. Accordingly, the epitaxial layer which is used as the collector regions 54 and 56 can be made thick, thereby permitting a high voltage transistor to be realized.

Now referring to FIGS. 2 to 11, an explanation will be given of the method of manufacturing the semiconductor integrated circuit device as shown in FIG. 1.

Figure 2:
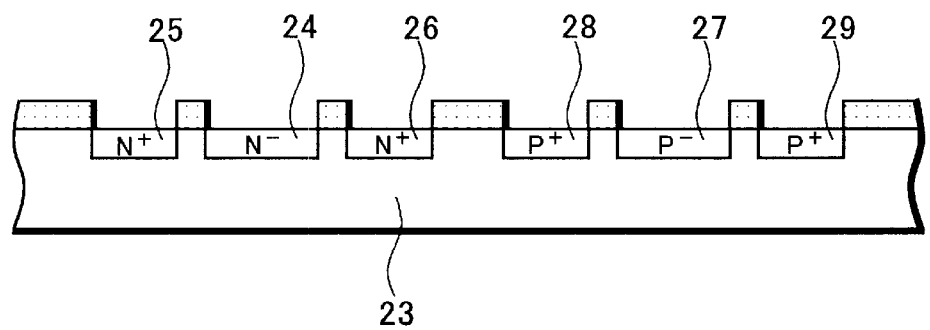
FIG. 2 is a sectional view for explaining a method for manufacturing the semiconductor integrated circuit device according to the invention.

First, as shown in FIG. 2, a P type monocrystal silicon substrate 23 of about 650 μm thickness is prepared, and oxide film is formed by thermal oxidation of surface of the substrate 23 so that a selecting mask is made by photo-etching the oxide film. Phosphorus (P) forming N− first buried layer 24 and N+ first buried layers 25 and 26, and boron (B) forming P− first buried layer 27 and P+ first buried layers 28 and 29 are ion-implanted and diffused in the surface of the substrate 23.

Figure 3:
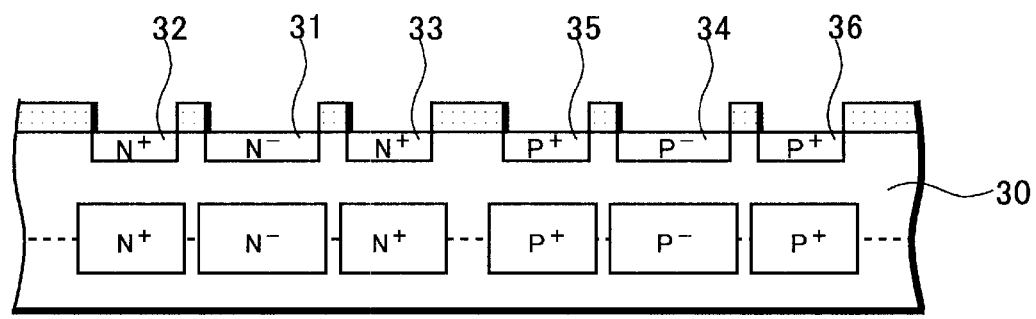
FIG. 3 is a sectional view for explaining a method for manufacturing the semiconductor integrated circuit device according to the invention.

Next, as shown in FIG. 3, after removing whole oxide film used as the selecting mask, the substrate 23 is arranged on a suscepter of an epitaxial growing apparatus, and N or N− first epitaxial layer 30 grows 18 to 22 μm by applying high temperature of 1140° C. to the substrate leading SiH$_2$Cl$_2$ gas and H$_2$ gas into reactant tube. Oxide film is formed by thermal oxidation of surface of first epitaxial layer 30, each selecting mask is made by photo-etching the oxide film. Phosphorus (P) forming N− second buried layer 31 and N+ second buried layers 32 and 33, and boron (B) forming P− second buried layer 34 and P+ second buried layers 35 and 36 are ion-implanted and diffused in the surface of the first epitaxial layer 30.

Figure 4:
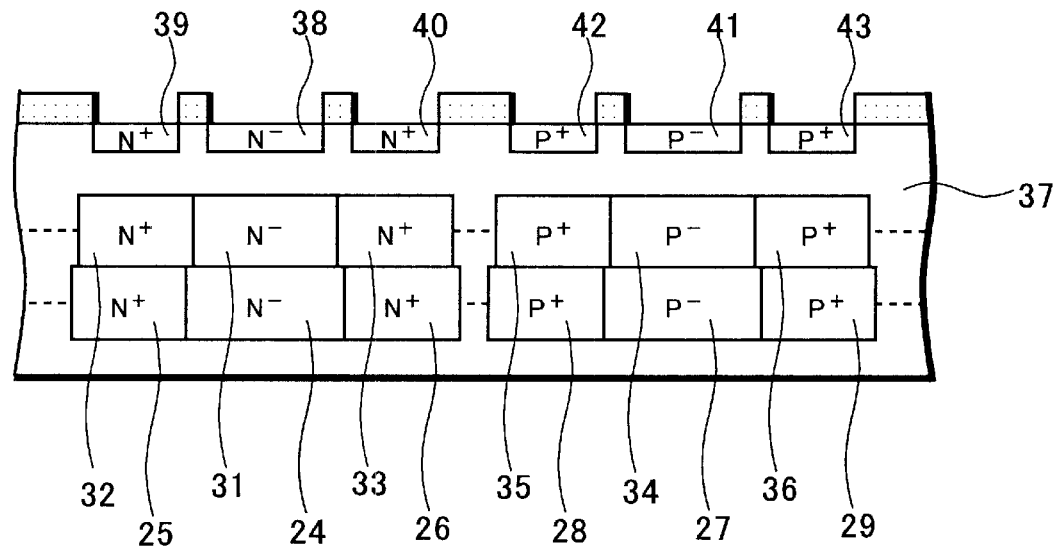
FIG. 4 is a sectional view for explaining a method for manufacturing the semiconductor integrated circuit device according to the invention.

Next, as shown in FIG. 4, after removing whole oxide film used as the selecting mask, the substrate 23 is arranged on a suscepter of an epitaxial growing device, and N or N− first epitaxial layer 37 grows 18 to 22 μm by applying high temperature of 1140° C. to the substrate leading SiH$_2$Cl$_2$ gas and H$_2$ gas into reactant tube. Oxide film is formed by thermal oxidation of surface of second epitaxial layer 37, each selecting mask is made by photo-etching the oxide film. Phosphorus (P) forming N− third buried layer 38 and N+ third buried layers 39 and 40, and boron (B) forming P*31* third buried layer 41 and P+ second buried layers 42 and 43 are ion-implanted and diffused in the surface of the second epitaxial layer 37.

At this time, at the same time, the N− first and second buried layers 24 and 31, the N+ first and second buried layers 25, 26, 32, and 33, the P− first and second buried layers 27 and 34, the P+ first and second buried layers 28, 29, 35, and 36 are diffused to connect.

Figure 5:
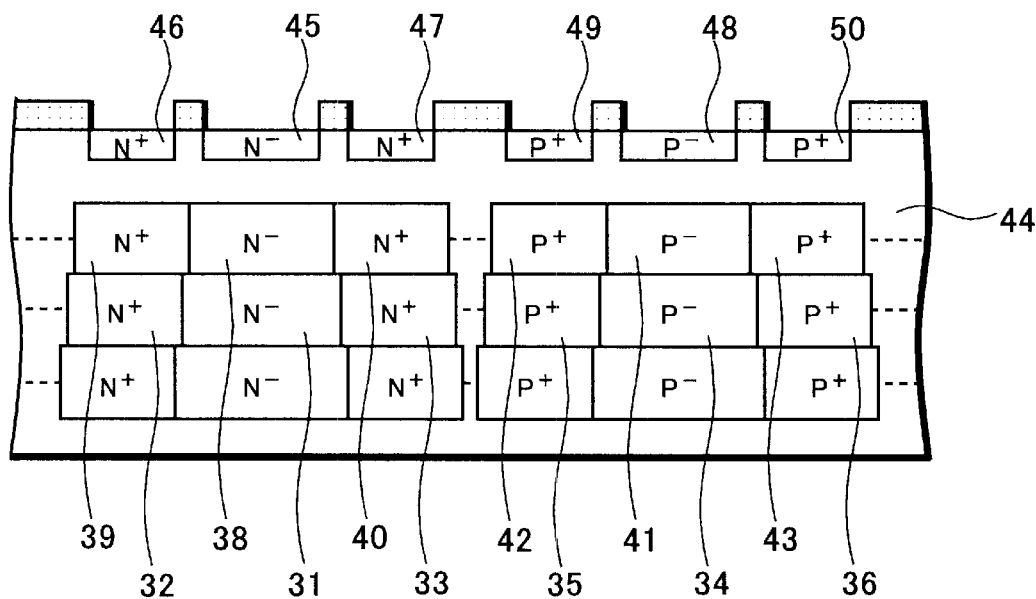
FIG. 5 is a sectional view for explaining a method for manufacturing the semiconductor integrated circuit device according to the invention.

Next, as shown in FIG. 5, after removing whole oxide film used as the selecting mask, the substrate 23 is arranged on a suscepter of an epitaxial growing device, and N or N− third epitaxial layer 44 grows 18 to 22 μm by applying high temperature of 1140° C. to the substrate leading SiH$_2$Cl$_2$ gas and H$_2$ gas into reactant tube. Oxide film is formed by thermal oxidation of surface of third epitaxial layer 44, each selecting mask is made by photo-etching the oxide film. Phosphorus (P) forming N− fourth buried layer 45 and N+ fourth buried layers 46 and 47, and boron (B) forming P− fourth buried layer 48 and P+ second buried layers 49 and 50 are ion-implanted and diffused in the surface of the third epitaxial layer 44.

At this time, at the same time, the N− second and third buried layers 31 and 38, the N+ second and third buried layers 32, 33, 39, and 40, the P− second and third buried layers 34, and 41, the P+ second and third buried layers 35, 36, 42, and 43 are diffused to connect.

Figure 6:
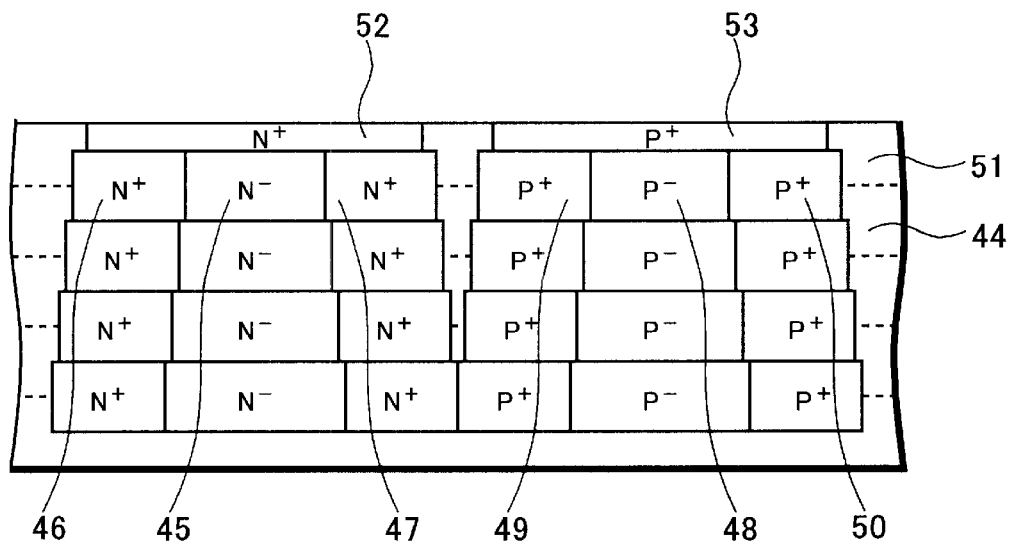
FIG. 6 is a sectional view for explaining a method for manufacturing the semiconductor integrated circuit device according to the invention.

Next, as shown in FIG. 6, after removing whole oxide film used as the selecting mask, the substrate 23 is arranged on a suscepter of an epitaxial growing device, and N or N− fourth epitaxial layer 51 grows 18 to 22 μm by applying high temperature of 1140° C. to the substrate leading SiH$_2$Cl$_2$ gas and H$_2$ gas into reactant tube. Phosphorus (P) forming N+ fifth buried layer 52 and boron (B) forming P+ fifth buried layer 53 are ion-implanted and diffused in the surface of the fourth epitaxial layer 51.

At this time, width of the N+ fifth buried layer 52 and the P+ fifth buried layer 53 is formed to almost similar width of the N− fourth buried layer 45, the N+ fourth buried layers 46 and 47, the P− fourth buried layer 48, the P+ second buried layers 49 and 50 formed on the third epitaxial layer 44. As the result of connecting each buried layer by diffusion process at high temperature, 1250° C., for about 16 hours, region forming the N+ collector region 54 of the NPN transistor 21, the N+ buried layer 55, the P− collector region 56 of the PNP transistor 22, and the P+ buried layer 57 is obtained as shown in the figure.

Now it should be noted that phosphorous (P) is used as N type impurities and boron (B) is used as P type impurities because the impurities having a high diffusing speed assures the coupling the buried layers for a short heat treating time.

Namely, this intends to form a flat profile in a short time in the N type impurity region and P type impurity region.

This invention is also characterized in that the regions where the NPN transistor 21 and PNP transistor 22 are to be formed can be formed simultaneously on the substrate 23.

Figure 7:
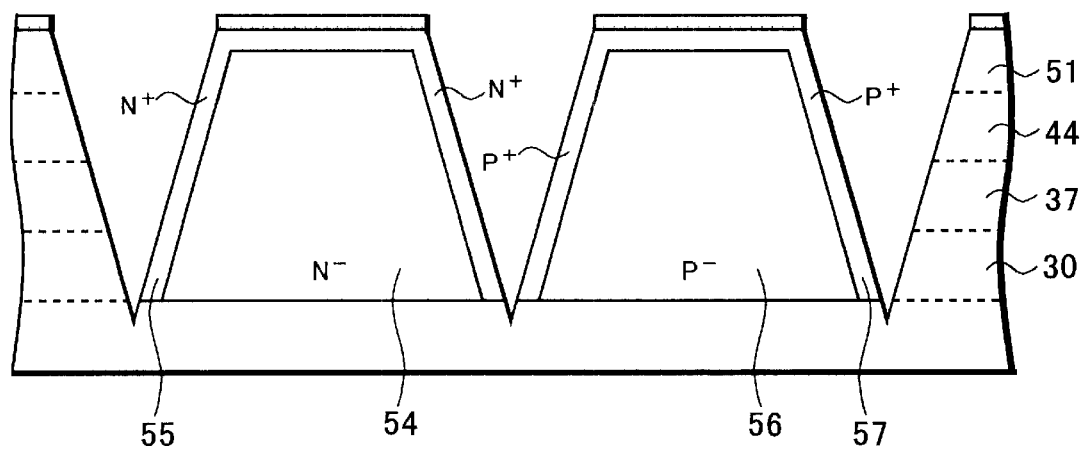
FIG. 7 is a sectional view for explaining a method for manufacturing the semiconductor integrated circuit device according to the invention.

Next, oxide film is formed by thermal oxidation of surface the fourth epitaxial layer 51 and a selecting mask is made by photo etching the oxide film as shown in FIG. 7. At this time, in order to decrease influence caused by interference between the NPN transistor 21 and the PNP transistor 22 formed closely on one chip and to depress generation of a parasitic transistor, it is need to realize isolation between elements of the $N^-$ collector region 54 forming the NPN transistor 21 and the $P^-$ collector region 56 forming the PNP transistor 22. By etching more deeply than the portion where the first epitaxial layer 30, the second epitaxial layer 37, the third epitaxial layer 44, the fourth epitaxial layer 51, the $N^-$ first buried layer 24, the $N^+$ first layers 25, 26, the $P^-$ first buried layers 27, the $P^+$ first buried layers 28, 29 of the substrate 23 are diffused, V grooves for element isolation are formed.

Figure 8:
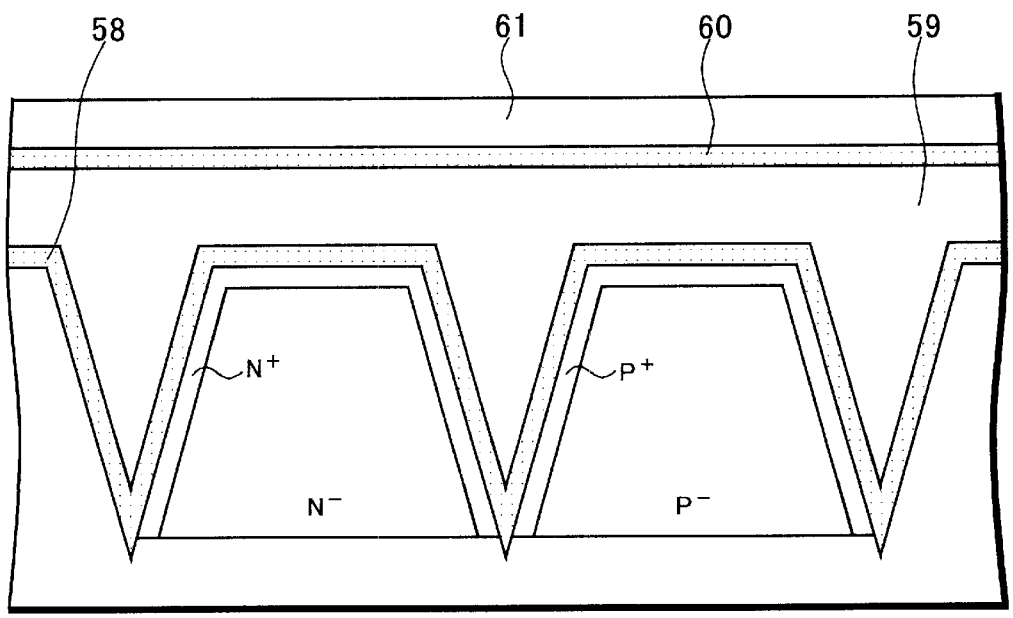
FIG. 8 is a sectional view for explaining a method for manufacturing the semiconductor integrated circuit device according to the invention.

Next, as shown in FIG. 8, deposition with CVD is carried out to make a polycrystal silicon 59 of about 150 μm in a high temperature of about 1240° C. for about one hour on a silicon oxide film 58. After that, the polycrystal silicon 59 is flattened by polishing so that even the thin part of film thickness is about 30 μm. A supporting substrate 61 is bonded by heat treatment of 1100 to 1200° C. for about 2 hours, which bonds the supporting substrate 61 over the surface of the polycrystal silicon 59 through a silicon oxide film 60. Here, the supporting substrate 61 may be made of material that resists the polishing process and may not need any conductive material.

Figure 9:
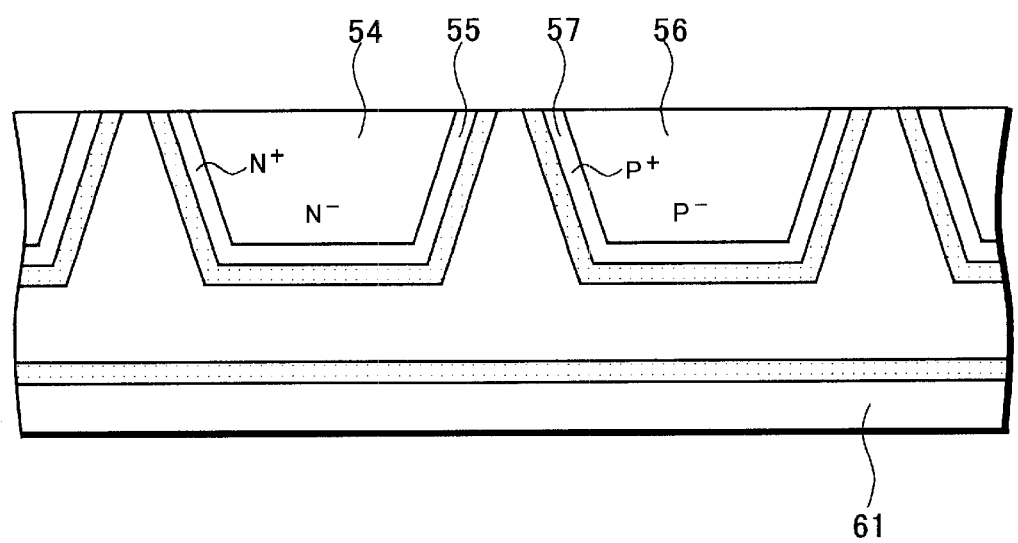
FIG. 9 is a sectional view for explaining a method for manufacturing the semiconductor integrated circuit device according to the invention.

Next, as shown in FIG. 9, the substrate is turned upside down so that the monocrystal Si substrate 23 constitutes an upper surface and the supporting substrate 61 constitutes a bottom surface. The silicon substrate 23 is polished about 580 μm till the $N^-$ collector region 54 and the $P^-$ collector region 56 expose from surface of the silicon substrate 23. At this time, the $N^-$ collector region 54 and the $P^-$ collector region 56 become a structure dielectric-isolated through the polycrystalsilicon 59. By this process, the $N^-$ collector region 54 and the $P^-$ collector region 56 are formed in film thickness of about 60 to 80 μm.

Figure 10:
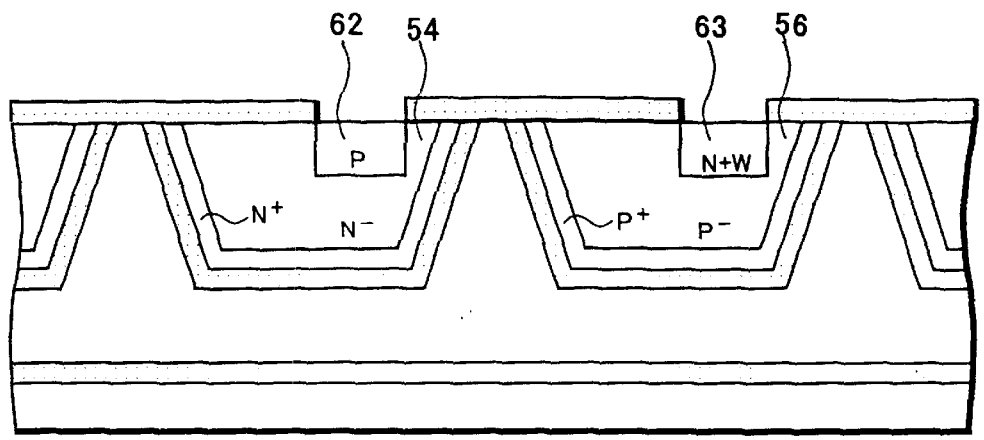
FIG. 10 is a sectional view for explaining a method for manufacturing the semiconductor integrated circuit device according to the invention.

Next, as shown in FIG. 10, a P type diffused region 62 is formed as a base region in the $N^-$ type collector region 54, and a $N^+$ type well region 63 is formed as a base region in the $P^-$ type collector region 56.

Figure 11:
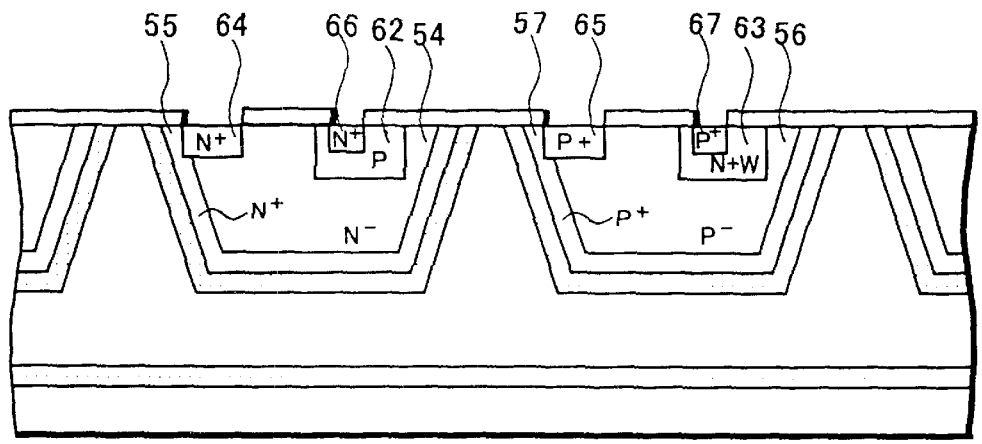
FIG. 11 is a sectional view for explaining a method for manufacturing the semiconductor integrated circuit device according to the invention.
Figure 12:
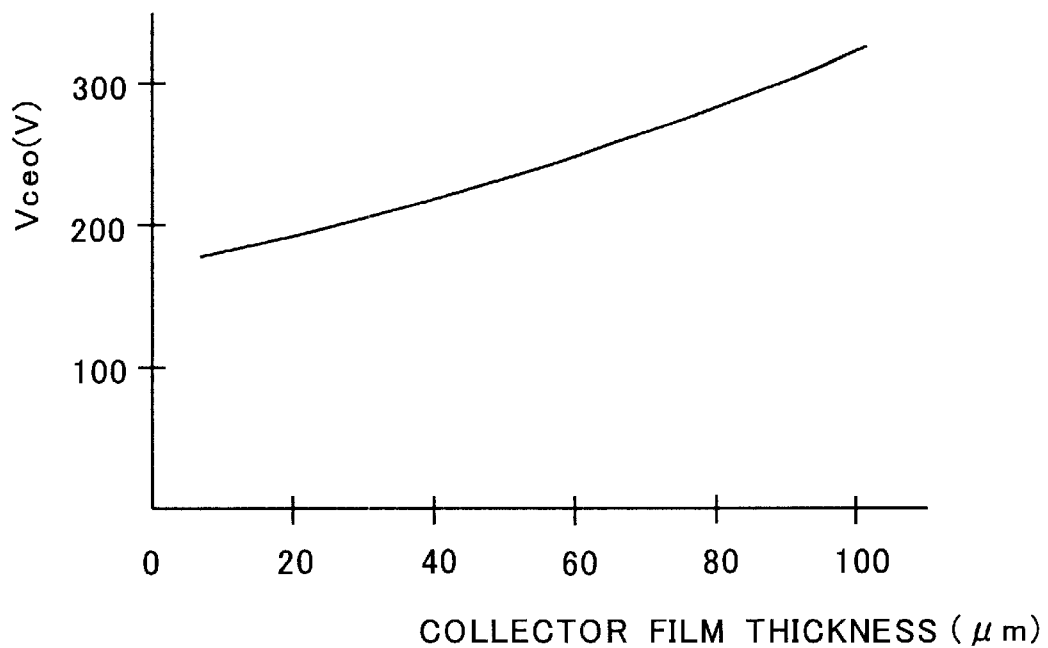
FIG. 12 is a graph showing relationship between the film thickenss and withstand voltage in complementary transistors dielectric-isolated in the semiconductor integrated circuit device according to the invention and voltage resistance.

Next, as shown in FIG. 11, the surface of the $N^-$ type collector region 54 and $P^-$ type collector region 56 are thermally oxidized to form an oxide film. The oxide film is photo-etched to provide a selective mask. Arsenic (As) is ion-implanted and diffused in the $N^-$ type collector region 54 to provide an $N^+$ diffused region 64 serving as a collector taking-out region, and boron (B) is ion-implanted and diffused in the $P^-$ type collector region 56 to provide a $P^+$ type diffused region 65 serving as a collector taking-out region. Simultaneously, an $N^+$ type diffused region 66 is formed as an emitter region in the P type diffused region 62 to make an NPN transistor 21. A $P^+$ type diffused region 67 is formed as an emitter region in the $N^+$ type well region 63 to make a PNP transistor 22.

In this step, since the $N^+$ type buried layer 55 and $P^+$ type buried layer 57 have been formed to extend to the surface along the slope of each of the etched V-grooves, the $N^+$ type collector taking-out region 64 and $P^+$ collector taking-out region 65 can be coupled with the $N^+$ type buried layer 55 and the $P^+$ type buried layer 57 in a short diffusion time, respectively. Further, even if there is a misalignment of the masks for the $N^+$ type collector taking-out region 64 and the $P^+$ type collector taking-out region 65, since the $N^+$ type buried layer 55 and $P^+$ type buried layer 57 have been formed to extend to the surface along the slope of each of the etched V-grooves, both can be easily coupled with each other by adjustment of a diffusion time. In this way, the $N^+$ type collector layer 64 and the $P^+$ type collector taking-out region 65 are coupled with the $N^+$ buried layer 55 and the $P^+$ type buried layer 57, respectively to constitute a structure with reduced collector resistance.

Thereafter, an oxide film is deposited on the entire surface, and aluminum is deposited from above the oxide film with openings where electrodes are to be formed, thereby forming electrodes 68. Thus, the semiconductor integrated circuit device as shown in FIG. 1 is formed.

Although a structure that four epitaxial layers are laminated is described about the above-mentioned mode for carrying out, effect similar to the above-mentioned semiconductor integrated circuit device can be obtained even if numbers of layers of the epitaxial layer laminated corresponding to the object for use.

Although the mask of the buried layer used at forming the collector region and high concentration buried layer is changed at every layer because width of the buried layer is formed narrow at each lamination of the epitaxial layer in the above-mentioned embodiment, the buried layer can be formed for all epitaxial layers using the same masks. This is an economical method for manufacturing as one mask is used.

According to the invention, high concentration layer region is formed and collector resistance is decreased by forming the buried layer of high concentration layer and connecting with the high concentration collector taking-out region, and the thick collector region is realized so as to realize a semiconductor integrated circuit device superior in high voltage resistance in the semiconductor integrated circuit device.

According to the method for manufacturing the semiconductor integrated circuit device of the invention, making the collector region thick is realized so as to realize a method for manufacturing a semiconductor integrated circuit device superior in high voltage resistance because many layers of the epitaxial layer are formed at process of forming the collector region.

Further, according to the method for manufacturing the semiconductor integrated circuit device of the invention, accurate etching can be carried out to deep portion by etching of V groove shape at process of etching the collector region, and dielectric is surely isolated by polycrystal silicon so as to realize a method for manufacturing a semiconductor integrated circuit device decreasing influence of mutual transistors.

Furthermore, according to the method for manufacturing the semiconductor integrated circuit device of the invention, at process forming a collector taking-out region at the periphery of collector region, the collector region and the collector taking-out region are formed at one time by forming the same process as the buried layer forming the collector region and the buried layer forming the collector taking-out region so as to realize a method for manufacturing a semiconductor integrated circuit device very superior in productivity.

Further, according to the method for manufacturing the semiconductor integrated circuit device of the invention, at process forming the collector taking-out region of complementary transistor, the high concentration buried layer is formed with incline by etching of V groove. Therefore, the collector taking-out region is connected to high concentration buried layer without almost diffusing the collector region, and is formed by the same process as the emitter region so as to realize a method for manufacturing a semiconductor integrated circuit device very superior in productivity.

What is claimed is:

1. A method for manufacturing a semiconductor integrated circuit device comprising:

providing a semiconductor substrate;

providing a plurality of epitaxial layers on said substrate;

providing doped impurity regions in each epitaxial layer when each epitaxial layer is provided;

diffusing the doped impurity regions to connect the regions;

etching both ends of said connected doped impurity regions in V-groove;

providing a first oxide film on the surface of the etched doped impurity regions;

providing a polycrystal semiconductor layer on the first oxide film;

providing a second oxide film on said polycrystal semiconductor layer and bonding a supporting substrate through the second oxide film; and polishing said semiconductor substrate at a side away from said supporting substrate, until said doped impurity regions are exposed.

2. A method for manufacturing a semiconductor integrated circuit device according to claim 1, further comprising:

providing said etched doped impurity regions to comprise a burial layer disposed substantially along inclined lines of said V groove and an island region bounded by the burial layer.

3. A method for manufacturing a semiconductor integrated circuit device according to claim 2, wherein said island region and said buried layer are formed by the same process.

4. A method for manufacturing a semiconductor integrated circuit device according to claim 2, wherein the buried layer forming the top of said island region.

5. A method for manufacturing a semiconductor integrated circuit device according to claim 2, wherein said island region is formed of a lightly-doped impurity, and said burial layer is formed of a highly-doped impurity.

6. A method for manufacturing a semiconductor integrated circuit device according to claim 1, further comprising:

providing in said epitaxial layers when each epitaxial layer is provided, second doped impurity regions disposed laterally to the doped impurity regions of claim 1, said second doped impurity regions having a conduction type opposite to the doped impurity regions;

diffusing the second doped impurity regions to connect the regions;

etching both ends of said connected second doped impurity regions in V-groove;

providing the first oxide film on the surface of the etched second doped impurity regions;

providing the polycrystal semiconductor layer on the first oxide film;

providing the second oxide film on said polycrystal semiconductor layer and bonding the supporting substrate through the second oxide film; and polishing said semiconductor substrate at the side away from said supporting substrate, until said second doped impurity regions are exposed.

7. A method for manufacturing a semiconductor integrated circuit device according to claim 6, further comprising:

providing said etched second doped impurity regions to comprise a second burial layer disposed substantially along inclined lines of said V groove and a second island region bounded by the second burial layer.

8. A method of manufacturing a semiconductor circuit device according to claim 1, further comprising:

providing in said epitaxial layers when each epitaxial layer is provided, second doped impurity regions disposed laterally to the doped impurity regions of claim 1 and disposed around regions to be a second island region to form a second burial layer, said second doped impurity regions having a conduction type opposite to the doped impurity regions, said expitaxial layer having the same conduction type as the second doped impurity regions;

diffusing the second doped impurity regions in V-groove;

providing the first oxide film on the surface of the etched second doped impurity regions;

providing the polycrystal semiconductor layer on the first oxide film;

providing the second oxide film on said polycrystal semiconductor layer and bonding the supporting substrate through the second oxide film; and polishing said semiconductor substrate at the side away from said supporting substrate, until said second doped impurity regions are exposed;

wherein said burial layer is disposed substantially along inclined line of said V-groove and said second island region is bounded by said second burial layer.

9. A method for manufacturing a semiconductor integrated circuit device according to claim 1, wherein said doped impurity regions are provided and diffused around an island region to form a burial layer disposed substantially along inclined lines of said V-groove, and said island region is bounded by the burial layer.

10. A method for manufacturing a semiconductor integrated circuit device comprising:

providing a semiconductor substrate;

providing a plurality of epitaxial layers on said substrate;

providing in each epitaxial layer when each epitaxial layer is provided, first doped impurity regions and second doped impurity regions disposed laterally to the first doped impurity regions, said second doped impurity regions having a conduction type opposite to the first doped impurity regions;

diffusing the first doped impurity regions and the second doped impurity regions to connect diffusively the first doped impurity regions together and to connect diffusively the second doped regions together;

etching ends of said connected first doped impurity regions in V-groove and etching ends of said connected second doped impurity regions in V-groove;

providing a first oxide film on the surfaces of the etched first doped impurity regions and the etched second doped impurity regions;

providing a polycrystal semiconductor layer on the first oxide film;

providing a second oxide film on said polycrystal semiconductor layer and bonding a supporting substrate through the second oxide film; and polishing said semiconductor substrate at a side away from said supporting substrate, until said first doped impurity regions and the second doped impurity regions are exposed.

11. A method for manufacturing a semiconductor integrated circuit device according to claim 10, further comprising:

providing said etched first doped impurity regions to comprise a first burial layer disposed substantially along inclined peripheries of said V groove and a first island region bounded by the first burial layer; and providing said etched second doped impurity regions to comprise a second burial layer disposed substantially along inclined peripheries of said V groove and a second island region bounded by the second burial layer.

12. A method for manufacturing a semiconductor integrated circuit device according to claim 11, further comprising:

providing the first and second burial layers to each comprise a highly-doped impurity diffused layer.

13. A method of manufacturing a semiconductor integrated circuit device, comprising:

providing a semiconductor substrate;

layering a plurality of epitaxial layers on said substrate;

providing in each epitaxial layer when each epitaxial layer is provided, first doped impurity regions and second doped impurity regions disposed laterally to the first doped impurity regions, said second doped impurity regions having a conduction type opposite to the first doped impurity regions;

diffusing the first doped impurity region and the second doped impurity regions;

etching each of said diffused first doped impurity regions and said diffused second doped impurity regions into a truncated upside V;

providing a first oxide film on the surfaces of the etched first doped impurity regions and the etched second doped impurity regions;

providing a polycrystal semiconductor layer over the first oxide film;

providing a second oxide film on said polycrystal semiconductor layer;

providing a supporting substrate over the second oxide film; and polishing said semiconductor substrate at a side away from said supporting substrate, until said first doped impurity regions and the second doped impurity regions are exposed.

14. A method for manufacturing a semiconductor integrated circuit device according to claim 13, further comprising:

providing said etched first doped impurity regions to comprise a first burial layer disposed substantially along inclined peripheries of said V groove and a first island region bounded by the first burial layer; and providing said etched second doped impurity regions to comprise a second burial layer disposed substantially along inclined peripheries of said V groove and a second island region bounded by the second burial layer.

15. A method for manufacturing a semiconductor integrated circuit device according to claim 14, further comprising:

providing the first and second burial layers to each comprise a highly-doped impurity diffused layer.

* * * * *